United States Patent
Lin et al.

(10) Patent No.: US 8,762,802 B2
(45) Date of Patent: Jun. 24, 2014

(54) CODE CHECKING METHOD FOR A MEMORY OF A PRINTED CIRCUIT BOARD

(75) Inventors: Poshen Lin, Shenzhen (CN); Liangchan Liao, Shenzhen (CN); Yu Wu, Shenzhen (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 189 days.

(21) Appl. No.: 13/379,847

(22) PCT Filed: Dec. 2, 2011

(86) PCT No.: PCT/CN2011/083354
§ 371 (c)(1),
(2), (4) Date: Dec. 21, 2011

(87) PCT Pub. No.: WO2013/078673
PCT Pub. Date: Jun. 6, 2013

(65) Prior Publication Data
US 2013/0145225 A1    Jun. 6, 2013

(30) Foreign Application Priority Data
Dec. 1, 2011    (CN) .......................... 2011 1 0392576

(51) Int. Cl.
*G11C 29/00*    (2006.01)

(52) U.S. Cl.
USPC ........................... 714/722; 714/776; 714/758

(58) Field of Classification Search
USPC ......... 714/722, 776, 758, 800, 48, 30, 27, 25, 714/28
See application file for complete search history.

(56) References Cited

U.S. PATENT DOCUMENTS

| | | | |
|---|---|---|---|
| 6,557,116 B1 * | 4/2003 | Matt et al. | 714/28 |
| 7,328,277 B2 * | 2/2008 | Hussey et al. | 709/238 |
| 7,984,363 B2 * | 7/2011 | Kushida | 714/776 |
| 8,112,678 B1 * | 2/2012 | Lewis et al. | 714/48 |

* cited by examiner

*Primary Examiner* — Fritz Alphonse

(57) ABSTRACT

A code checking method for a memory of a printed circuit board is disclosed, and is used to firstly add a check code to a data end of codes, after the codes is written in a memory, then use a timing controller to calculate a checksum of the data of the part of the primary codes and further compare the calculated checksum with the check code, and then output to a probe via a testing pin to display the result of comparison, so as to accomplish an object of checking if the written codes are correct. Thus, work efficiency of checking the codes written in the memory is enhanced.

7 Claims, 2 Drawing Sheets

CODE CHECKING METHOD FOR A MEMORY OF A PRINTED CIRCUIT BOARD

FIELD OF THE INVENTION

The present invention relates to a checking method for a printed circuit board, and more particularly to a code checking method for a memory of a printed circuit board.

BACKGROUND OF THE INVENTION

In conventional technologies, the driving system of a liquid crystal display device uses a timing controller to read the codes written in a read-only memory to perform certain control techniques, such as timing, dimming, over-driving and gamma correcting, to a liquid crystal panel. In order to facilitate the manufacturing efficiency of the hardware of the driving system, manufacturers usually write codes into the foregoing read-only memory in advance, and mount the read-only memory with other components onto the surface of a printed circuit board by using SMT or DIP technologies, and then check the codes when performing an electrical tests to the printed circuit board in the end.

How, during the foregoing mounting process of the printed circuit board, the timing controller of the printed circuit board after mounting may read wrong codes due to environmental disturbances, mechanical properties or human errors, such that the display device may wrongly display, or even unable to display. Therefore, performing a code checking step is important after the mounting of the printed circuit board.

With reference to FIG. 1, which is a flow chart of code writing and checking for a read-only memory of a printed circuit board according to the prior art, disclosing steps of: firstly writing codes to EEPROM (Electrically-Erasable Programmable Read-Only Memory) (step 90); then reading the check sum of the written codes (step 91); checking if the checksum is correct (step 92); if correct, then finishing check (step 93); if not, and then re-writing the codes (step 94). The conventional checking method needs to combine some fixtures and a computer, use a probe of the fixtures to contact a plurality of auxiliary writing points of the printed circuit board, cooperate with the computer operated by software to read the written codes, calculate the checksum, and then check if the checksum of the written codes is equal to the checksum of original codes. If they were not equal, then the codes have to be written via the writing points.

Since the conventional checking method needs to combine the computer and the fixtures to perform one-by-one operation with the probe, and then read the result from the software. Not only the work time is increased, the stability of the fixture and the software may also affect the checking result.

Hence, it is necessary to provide a code checking method for a memory of a printed circuit board to overcome the problems existing in the conventional technology.

SUMMARY OF THE INVENTION

A primary object of the present invention is to provide a code checking method for a memory of a printed circuit board to solve a problem that the conventional code checking method of a printed circuit board needs to combine with a computer and fixtures and thereby increase work time.

To achieve the above object, the present invention provides a code checking method for a memory of a printed circuit board, which comprises steps of:

S10: reading code data written in a memory, wherein the code data includes primary code data and a check code added to an end of the primary code data;

S11: calculating the checksum of the primary code data;

S12: comparing if the checksum of the primary code data and the check code are equal;

S13: outputting a testing signal to a testing pin according to the result of the comparison; and S14: using a probe to contact the testing pin to obtain the testing result.

In one embodiment of the present invention, the steps from S10 to S13 are executed by a timing controller, and the timing controller has a weighting comparison module built therein.

In one embodiment of the present invention, the check code is a hexadecimal number, wherein in the step S11, the timing controller performs a weighted sum calculation for the primary code data to use the last four digits of the calculated hexadecimal number as the checksum.

In one embodiment of the present invention, the memory is an electrically-erasable programmable read-Only memory.

In one embodiment of the present invention, in the step S14, the probe has a display function and can display the testing result.

In one embodiment of the present invention, the probe has a light-emitting diode; if the checksum of the primary code data is equal to the check code, the outputted testing signal is a high electric potential signal that light up the light-emitting diode through the testing pin.

The present invention is to add a check code to the end of the code data, and use the timing controller to calculate the checksum of the data of the parts of the primary code after being written into the memory, and then compare the calculated checksum with the check code, and then output to the probe via the testing pin to display the result of comparison, so as to achieve the object of checking if the written codes is correct. Since the testing process does not need any computer software operation, it is helpful for saving work time and labor cost.

DETAILED DESCRIPTION OF THE PREFERRED EMBODIMENTS

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inner, outer, side and etc., are only directions referring to the accompanying drawings, so that the used directional terms are used to describe and understand the present invention, but the present invention is not limited thereto.

Figure 1:
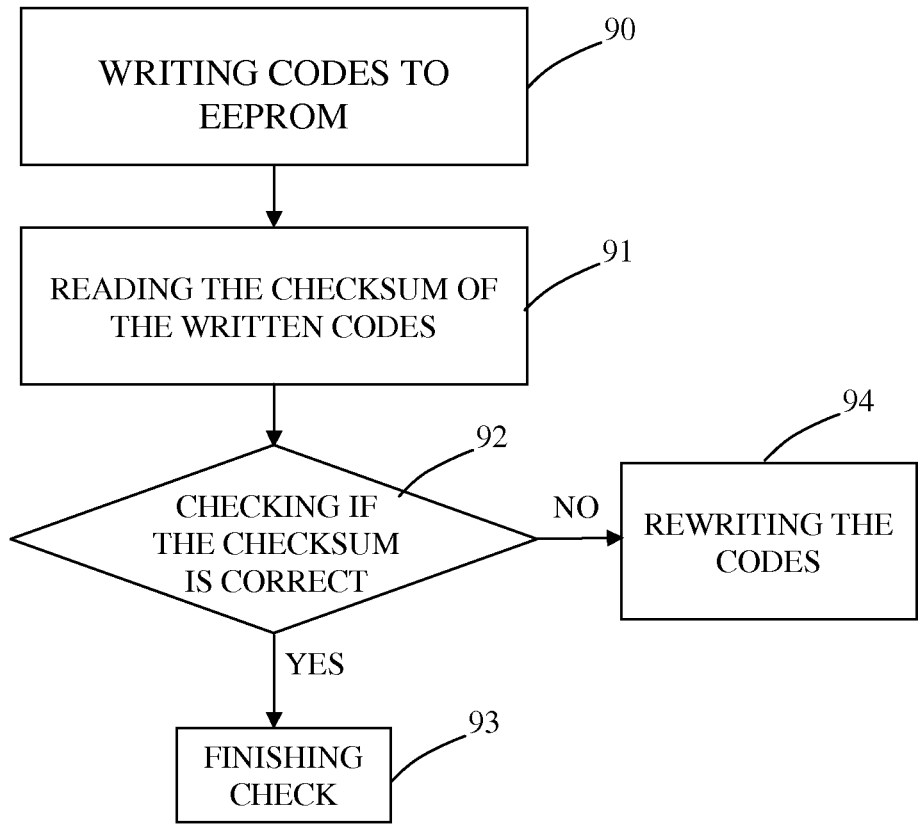
FIG. 1 is a flow chart of code writing and checking for a read-only memory of a printed circuit board according to the prior art.
Figure 2:
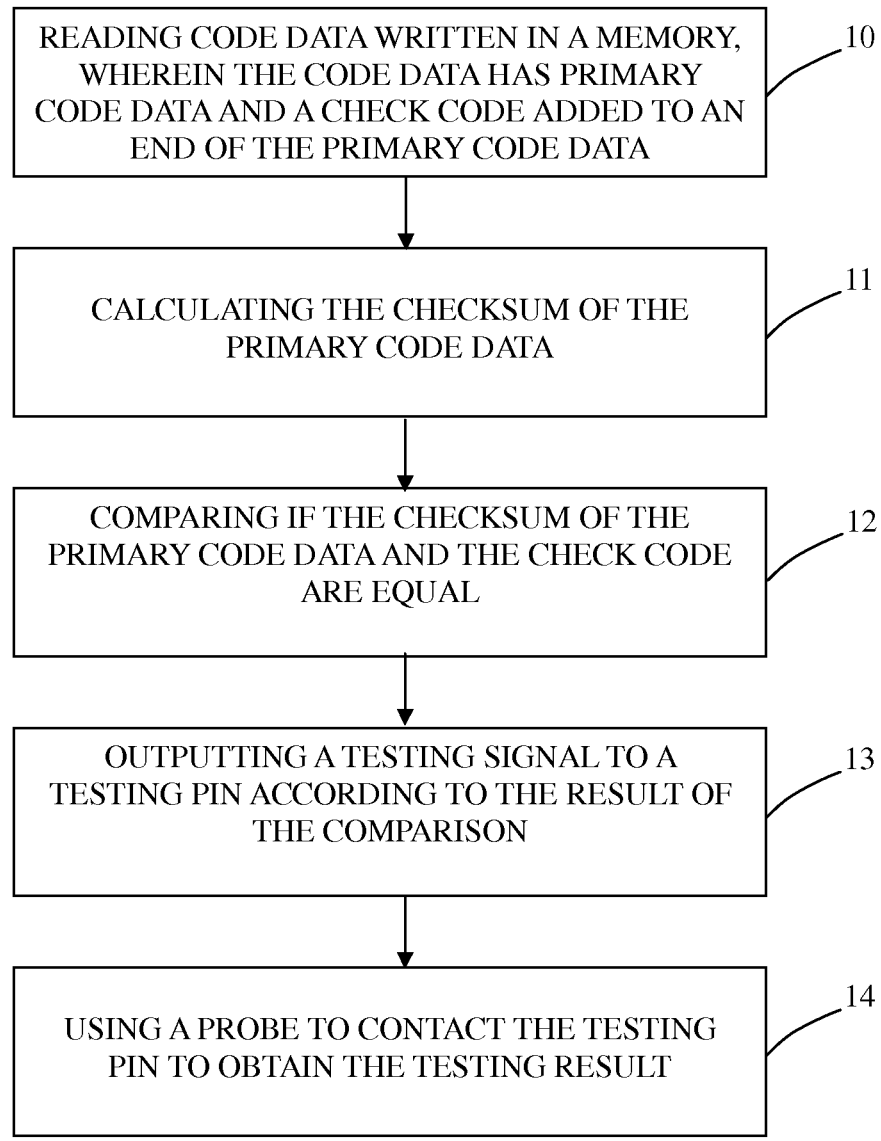
FIG. 2 is a flow chart of a preferred embodiment of a code checking method for a memory of a printed circuit board in accordance with the present invention.

With reference to FIG. 2, FIG. 2 is a flow chart of a preferred embodiment of a code checking method for a memory of a printed circuit board in accordance with the present invention. As shown in FIG. 2, the code checking method for a memory of a printed circuit board in accordance with the present invention comprises follow steps:

S10: reading code data written in a memory, wherein the code data includes primary code data and a check code added to an end of the primary code data;

S11: calculating the checksum of the primary code data;

S12: comparing if the checksum of the primary code data and the check code are equal;

S13: outputting a testing signal to a testing pin according to the result of the comparison; and S14: using a probe to contact the testing pin to obtain the testing result.

In the step S10, the memory is an electrically-erasable programmable read-only memory (EEPROM), but is not limited thereto.

The code data primarily use original codes as the primary codes, and the checksum of the original codes are added to a data end of the primary codes to be as a check code, so as to form a new code data block for being written into the memory. The check code is preferably a hexadecimal number.

In this embodiment, the steps S10 to S13 are executed by a timing controller, and the timing controller has a weighting comparison module built therein, therefore it is able to calculate the checksum of the primary code data and compare the checksum of the primary code data with the check code. Furthermore, in the step S11, the timing controller performs a weighted sum calculation to the primary code data and uses the last four digits of the calculated hexadecimal number as the checksum to further compare with the check code.

In the embodiment, the probe described in the step S14 preferably has a display function, which is able to display the testing result. To be more detailed, the probe may have a light-emitting diode; and if the checksum of the primary code data is equal to the check code, the timing controller may output a high electric potential testing signal to the testing pin, after the probe contacts the testing pin, the light-emitting diode thereof will be lighted up. Hence, it can be observed if the written codes are correct from the bright/dark statuses of the light-emitting diode.

It can be known from the foregoing description that the present invention is to add a check code to the data end of the codes waiting to be written, and the check code is the checksum of the codes. After the codes are written in the memory of the printed circuit board, when the circuit board is electrically driven for testing, a timing controller having a weighting comparison function can immediately calculate the checksum of the data of the parts of the primary codes, and then compare the calculated checksum with the check code, and then output a high electric potential or low electric potential testing signal through a testing pin, and then use a probe to receive the testing signal to display the testing result to the testing operator, so as to achieve the object of checking if the written codes are correct.

Since the foregoing testing process does not require computer software operation, it is helpful for saving work time and labor cost. Comparing with the conventional code checking process for the read-only memory of the printed circuit board, the present invention relatively enhances work efficiency of checking the codes written in the memory, and saves the expenses of fixtures.

The present invention has been described with a preferred embodiment thereof and it is understood that many changes and modifications to the described embodiment can be carried out without departing from the scope and the spirit of the invention that is intended to be limited only by the appended claims.

The invention claimed is:

1. A code checking method for a memory of a printed circuit board, comprising steps of:
   (S10) using a timing controller to read code data written in a memory, wherein the code data includes primary code data and a check code added to an end of the primary code data;
   (S11) using the timing controller to calculate the checksum of the primary code data;
   (S12) using the timing controller to compare if the checksum of the primary code data and the check code are equal;
   (S13) using the timing controller to output a testing signal to a testing pin according to the result of the comparison; and
   (S14) using a probe to contact the testing pin to obtain the testing result, wherein the probe has a display function and can display the testing result.

2. A code checking method for a memory of a printed circuit board, comprising steps of:
   (S10) reading code data written in a memory, wherein the code data includes primary code data and a check code added to an end of the primary code data;
   (S11) calculating the checksum of the primary code data;
   (S12) comparing if the checksum of the primary code data and the check code are equal;
   (S13) outputting a testing signal to a testing pin according to the result of the comparison; and
   (S14) using a probe to contact the testing pin to obtain the testing result.

3. The code checking method for a memory of a printed circuit board as claimed in claim 2, wherein the steps from (S10) to (S13) are executed by a timing controller, and the timing controller has a weighting comparison module built therein.

4. The code checking method for a memory of a printed circuit board as claimed in claim 3, wherein the check code is a hexadecimal number, wherein in the step (S11), the timing controller performs a weighted sum calculation for the primary code data to use the last four digits of the calculated hexadecimal number as the checksum.

5. The code checking method for a memory of a printed circuit board as claimed in claim 2, wherein the memory is an electrically-erasable programmable read-only memory.

6. The code checking method for a memory of a printed circuit board as claimed in claim 2, wherein in the step (S14), the probe has a display function and can display the testing result.

7. The code checking method for a memory of a printed circuit board as claimed in claim 6, wherein the probe has a light-emitting diode; if the checksum of the primary code data is equal to the check code, the outputted testing signal is a high electric potential signal that light up the light-emitting diode through the testing pin.

* * * * *